US007247976B2

(12) United States Patent
Sashida et al.

(10) Patent No.: US 7,247,976 B2
(45) Date of Patent: Jul. 24, 2007

(54) PIEZOELECTRIC VIBRATOR

(75) Inventors: Norikazu Sashida, Haruna-Machi (JP); Humihisa Itoh, Haruna-Machi (JP); Shigeo Ishii, Haruna-Machi (JP); Yoshiyuki Watanabe, Haruna-Machi (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 11/533,245

(22) Filed: Sep. 19, 2006

(65) Prior Publication Data

US 2007/0013270 A1 Jan. 18, 2007

Related U.S. Application Data

(62) Division of application No. 10/897,588, filed on Jul. 23, 2004.

(30) Foreign Application Priority Data

Jul. 24, 2003 (JP) ............................ 2003-279478

(51) Int. Cl.
*H01L 41/04* (2006.01)
*H04R 17/00* (2006.01)

(52) U.S. Cl. ...................... 310/330; 310/331; 310/332; 381/114; 381/173; 381/190

(58) Field of Classification Search ........ 310/330–332; 381/114, 173, 190
See application file for complete search history.

(56) References Cited

U.S. PATENT DOCUMENTS 4,045,695 A * 8/1977 Itagaki et al. ............... 310/322
4,430,529 A * 2/1984 Nakagawa et al. ......... 381/190
4,453,044 A 6/1984 Murphy
6,865,277 B2 3/2005 Bank et al.
2003/0053642 A1* 3/2003 Bank et al. ................. 381/152

FOREIGN PATENT DOCUMENTS

EP 1 574 297 A1 9/2005
JP 2000-134682 A 5/2000
JP 2000-224696 A 8/2000

* cited by examiner

*Primary Examiner*—Darren Schuberg
*Assistant Examiner*—J. San Martin
(74) *Attorney, Agent, or Firm*—Knobbe Martens Olson & Bear, LLP

(57) ABSTRACT

A piezoelectric vibrator having excellent shock resistance and high reliability is offered. The centers of first and second piezoelectric vibrating plates are supported by pillars on a main surface of an enclosure and nearly or substantially parallel to the main surface of the enclosure. Spacers having a Young's modulus of less than 2 GPa are mounted on both end sides of the second piezoelectric vibrating plate to prevent contact between the vibrating plates, thus preventing damage. Other spacers are mounted on the main surface of the enclosure in positions corresponding to the first-mentioned spacers to prevent contact with the main surface of the enclosure, thus preventing damage to the second piezoelectric vibrating plate.

10 Claims, 10 Drawing Sheets

PIEZOELECTRIC VIBRATOR

This is a divisional of U.S. patent application Ser. No. 10/897,588, filed Jul. 23, 2004, which claims foreign priority under 35 U.S.C. § 119 to Japanese Patent Application No. 2003-279478, filed Jul. 24, 2003, and the disclosure of which is herein incorporated by reference in their entirety.

BACKGROUND OF THE INVENTION

1. Field of the Invention

The present invention relates to a piezoelectric vibrator used in an acoustic transducing electronic appliance (such as an enclosure vibration type flat speaker or receiver) or in a vibration transducing electronic appliance such as a vibrator. More particularly, the invention relates to a piezoelectric vibrator having improvements in shock resistance, mountability, and reliability.

2. Description of the Related Art

Piezoelectric vibrators utilizing piezoelectric elements are widely employed as simple electro-acoustic transducers and actuators. Especially, in recent years, they are often used in the field of mobile phones, personal digital assistants, and so on. A conventional piezoelectric vibrator (e.g., Japanese Patent Laid-open No. 2000-224696-, especially FIGS. 4-8)) uses a bimorph device or unimorph device obtained by bonding together piezoelectric elements on the surface of a metallic vibrating plate. The device is supported around its center by a support member, constituting a cantilevered piezoelectric vibrator. When this vibrator is driven, high driving force is obtained in a low frequency range.

In another actuator, plural piezoelectric vibrating plates having different resonant frequencies are used to produce a distribution mode. For example, International Publication WO 01/54450, especially FIG. 9, discloses a transducer in which plural rectangular_piezoelectric vibrating plates are supported as a piezoelectric vibrator for a panel speaker by a single pillar substantially parallel over the panel. Vibration of the piezoelectric vibrating plates is transmitted to the panel via the pillar to thereby vibrate the panel. Thus, sound is produced. Japanese Patent Laid-open No. 2000-134682, especially FIGS. 1 and 3, describes a sound-producing device in which one or more disk-like piezoelectric vibrating plates are supported by a single pillar. A resilient body is mounted along the fringes of the vibrating plates. Thus, the acoustic feature is improved.

FIG. 10 shows one example of the conventional piezoelectric vibrators. In the shown piezoelectric vibrator 200, a piezoelectric vibrating body 201 is fixed on an acoustic panel 202, a body 201 consisting of a pillar 204 and piezoelectric vibrating plates 206, 212. The piezoelectric vibrating plates 206 and 212 are supported by the pillar 204 so as to be substantially parallel to the acoustic panel 202. The piezoelectric vibrating plate 206 is considered to have a bimorph structure. That is, piezoelectric elements 209 and 210 are bonded to a vibrating plate 208 made of a metal-based material such as 42 alloy or a resinous material such as polyethylene terephthalate (PET). An electrode layer of Ni, Pd, Ag, or the like is formed on a surface of each of the piezoelectric elements 209 and 210. The other piezoelectric vibrating plate 212 is similar in structure. Piezoelectric elements 215 and 216 are bonded to a vibrating plate 214. Thus, a bimorph structure is formed. The pillar 204 is molded from a metal-based material such as stainless steel or from a resinous material such as PET or acrylonitrile butadiene styrene (ABS). The acoustic panel 202 is made of glass or aluminum of honeycomb structure, for example.

Lead wires 222 and 228 are connected to the electrodes of the piezoelectric vibrating plates 206 and 212 and the vibrating plates 208, 214 by a conductive paste or by solder 218, 220, 224, 226, for example. An electrical signal is applied via the lead wires 222 and 228, so that the piezoelectric vibrating plates 206 and 212 vibrate. The vibration is transmitted to the pillar 204. The vibration is further transmitted via the pillar 204 to the acoustic panel 202 to which the piezoelectric vibrating body 201 is fixed. Consequently, the acoustic panel 202 vibrates, producing sound. However, the conventional device described so far has the following problems.

(1) When an impact load is applied to the piezoelectric vibrating body, an excessive stress is applied to the piezoelectric vibrating plates. This may destroy the piezoelectric elements made of a fragile material, or they may come off the pillar or the vibrating plates may bend. In this way, structural damage occurs. In addition, a pyroelectric effect produces an electromotive force. Concomitantly with this, there arises the danger that the circuit is affected. Furthermore, where plural piezoelectric vibrating plates are used, contact between any piezoelectric vibrating plate and its enclosure leads to destruction of the piezoelectric elements. Further, collision between the piezoelectric vibrating plates destroys the piezoelectric elements.

(2) Where plural piezoelectric vibrating plates are used, mounting methods including an electrical connection method such as soldering using cotton threads, bonding of the piezoeletric vibrating plates to the pillar, and mounting of the pillar and electrical connector terminals are complicated. This deteriorates the productivity and increases the cost of production.

SUMMARY OF THE INVENTION

In view of the foregoing, in an embodiment, an object of the present invention is to provide a piezoelectric vibrator having excellent shock resistance. Another object is to provide improved mountability and reliability of piezoelectric vibrating plates.

To achieve at least one of the above objects, in an embodiment, the present invention provides a piezoelectric vibrator having at least one piezoelectric vibrating plate made of a piezoelectric element on which electrodes are formed, the vibrating plate being supported to an enclosure so as to be vibratable. This piezoelectric vibrator is characterizable in that it has support means mounted around the center of the piezoelectric vibrating plate and amplitude limitation means mounted between the piezoelectric vibrating plate and one of the main surfaces of the enclosure. The support means may support the piezoelectric vibrating plate nearly or substantially parallel to this main surface. The thickness of the amplitude limitation means may be less than a distance between the piezoelectric vibrating plate and the main surface to effectively prevent contact between the piezoelectric vibrating plate and the main surface. In a preferred embodiment, the at least one piezoelectric vibrating plate is plural in number. These vibrating plates may be supported by the support means so as to be nearly or substantially parallel to each other. The amplitude limitation means may be mounted between the plural piezoelectric vibrating plates to prevent contact between the piezoelectric vibrating plates. Preferably, Young's modulus of the amplitude limitation means may be less than 2 GPa.

The foregoing and other objects, features, and advantages of the invention will become apparent from the following detailed description and accompanying drawings.

According to various embodiments of the present invention, one or more of the following advantages (including each advantage described within each section) can be obtained.

(1) When the amplitude limitation means are mounted between one main surface of the enclosure and each piezoelectric vibrating plate and between the plural piezoelectric vibrating plates, large amplitudes are suppressed. Stress applied to the piezoelectric elements can be mitigated. Damage can be prevented. Furthermore, the shock resistance can be improved because damage due to collision between the plural piezoelectric vibrating plates and due to collision between each piezoelectric vibrating plate and the enclosure can be prevented.

(2) When the space between one main surface of the enclosure and each piezoelectric vibrating plate and the space between the plural piezoelectric vibrating plates are filled with acceleration suppression means, vibration is transmitted via the acceleration suppression means. Therefore, displacement having a sharp rising edge can be suppressed. Generation of load inducing destruction of the piezoelectric elements can be suppressed.

(3) When both ends of each piezoelectric vibrating plate are fixed with pillars and supported so as to be nearly or substantially parallel to the main surface of the enclosure, the generated displacement can be suppressed as compared with a cantilevered structure in which the piezoelectric vibrating plate is supported only around its center. Hence, destruction of the piezoelectric elements can be prevented.

(4) When the piezoelectric vibrating plates fitted with positioning means are incorporated in the enclosure having the pillars therein, positioning can be performed with greater ease. The plural piezoelectric vibrating plates can be supported by members fitted with connector terminals. In consequence, mounting including electrical connection can be facilitated. Furthermore, the case structure permits easy handling. It is not necessary to take account of the effects on the surroundings of the mounted parts. Also, the piezoelectric vibrating plates do not come off the pillar. In addition, when acceleration suppression means is sealed in the enclosure, rapid deformation acceleration of the piezoelectric vibrating plates can be suppressed. The shock resistance can be improved. At the same time, electromotive force due to deformation can also be reduced.

(5) The piezoelectric vibrating plates provided with the positioning means may be incorporated in the enclosure incorporating the pillar. The plural piezoelectric vibrating plates may be supported by the members fitted with the connector terminals. Slopes for suppressing the restriction to the piezoelectric vibrating plates are provided. Therefore, bending of the vibrating plates and cracks in the piezoelectric bodies can be prevented. The shock resistance can be improved.

In all of the foregoing embodiments, any element used in an embodiment can interchangeably be used in another embodiment, and any combination of elements can be applied in the embodiments, unless it is not feasible.

For purposes of summarizing the invention and the advantages achieved over the related art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

DESCRIPTION OF THE PREFERRED EMBODIMENTS

As explained above, the present invention can be accomplished in various ways including, but not limited to, the foregoing embodiments. The present invention will be explained in detail with reference to the drawings, but the present invention should not be limited thereto.

The best mode for carrying out the present invention is hereinafter described in detail based on its some embodiments. These embodiments are preferred embodiments and do not intend to restrict the present invention, and elements described in each embodiment can interchangeably be used in another embodiment unless application is not feasible.

Embodiment 1

Figure 1A:
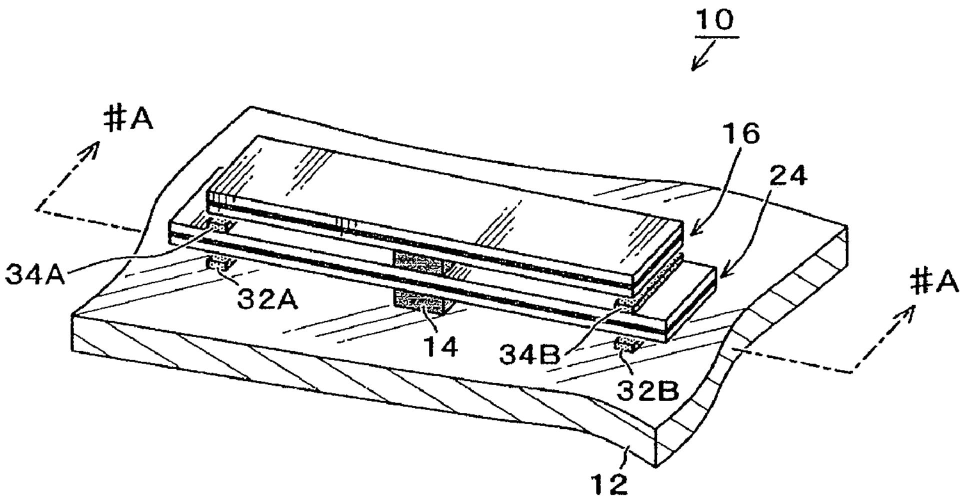
FIG. 1A is a perspective view showing the outer appearance of Embodiment 1 of the present invention.
Figure 1B:
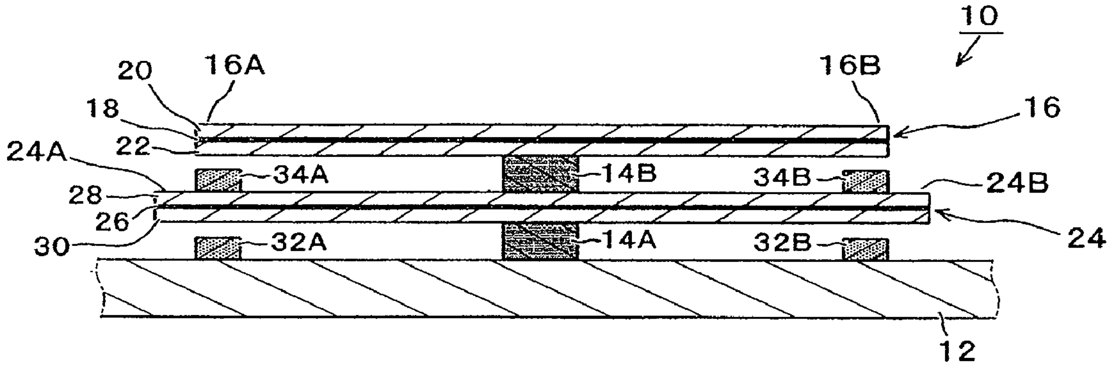
FIG. 1B is a cross-sectional view taken along line #A-#A of FIG. 1A.

Embodiment 1 of the present invention is first described with reference to FIGS. 1A and 1B. FIG. 1A is a perspective view showing the outer appearance of the present embodiment. FIG. 1B is a cross-sectional view showing the state obtained when a cross section taken along line #A-#A of FIG. 1A is viewed in the direction of the arrows.

As shown in the figures, a piezoelectric vibrator 10 of the present embodiment has substantially rectangular piezoelectric vibrating plates 16 and 24. Nearly central portions of the plates 16 and 24 are mounted to one main surface of the enclosure or case 12 of a mobile phone or the like by pillars 14A and 14B so as to be substantially parallel to the enclosure 12. The piezoelectric vibrating plates 16, 24 and pillars 14A, 14B are stacked in the following order enclosure 12, pillar 14A, piezoelectric vibrating plate 24, pillar 14B, and piezoelectric vibrating plate 16. They are fastened with adhesive or the like. This lamination may be held from above with a machine screw or with a screw. The pillars 14A and 14B are made of an iron-based alloy such as stainless steel, a copper-based alloy such as brass, or a hard resin such as polycarbonate. The material is not limited to these examples. Rather, various well-known materials can be used.

The piezoelectric vibrating plate 16 is a bimorph structure fabricated by bonding piezoelectric elements (piezoelectric ceramics) 20 and 22 on the front and rear surfaces of a substantially rectangular vibrating plate 18. The piezoelectric elements 20 and 22 are substantially identical in dimensions with the vibrating plate 18 and polarized in the direction of thickness. Each of the piezoelectric elements 20 and 22 consists of a piezoelectric body having driving electrode layers (not shown) formed on its front and rear surfaces. The other piezoelectric vibrating plate 24 is similar in structure and has piezoelectric elements 28 and 30 bonded to the front and rear surfaces of the vibrating plate 26, thus forming a bimorph structure. Also, with respect to the piezoelectric elements 28 and 30, electrode layers (not shown) are formed on the front and rear surfaces of each element. For example, 42 alloy, brass, or the like is used as the vibrating plates 18 and 26. For instance, PZT (lead zirconate titanate) or the like is used as the piezoelectric bodies of the piezoelectric elements 20 and 22. Silver, platinum, or palladium, for example, is used as the electrode layers.

A voltage is applied to each of the upper and lower electrodes of the piezoelectric element 20 and across the upper and lower electrodes of the piezoelectric element 22 to induce a polarization in each of the piezoelectric bodies of the piezoelectric elements 20 and 22. The piezoelectric elements 20 and 22 polarized in this way are bonded to the vibrating plate 18 using a conductive adhesive, for example. Consequently, the piezoelectric vibrating plate 16 is obtained. In the present embodiment, the lower electrode of the piezoelectric element 20, upper electrode of the piezoelectric element 22, and vibrating plate 18 are at a common potential and grounded if necessary.

Furthermore, in the present embodiment, spacers 34A and 34B are mounted on both end portions 24A and 24B of the piezoelectric vibrating plate 24. Other spacers 32A and 32B are mounted on the main surface of the enclosure 12 and in positions opposite to the spacers 34A and 34B. These spacers 32A, 32B, 34A, and 34B act to forcibly suppress the amplitude to prevent the piezoelectric vibrating plates 16 and 24 from exhibiting large amplitudes exceeding a designed range. The spacers are made of a soft material having a Young's modulus of less than 2 GPa. Any material may be used as the material of the spacers 32A, 32B, 34A, 34B as long as the Young's modulus is satisfied. For example, a bulk material such as polyethylene, polypropylene, nylon, or synthetic rubber or a material whose rigidity has been substantially deteriorated by foaming a hard resin such as polystyrene, or melanin resin, can be used.

The operation of the present embodiment is next described. The piezoelectric vibrating plates 16 and 24 of the aforementioned bimorph structure act as general piezoelectric bimorphs and vibrate. That is, in the piezoelectric vibrating plate 16, because of the direction of polarization of the polarizing bodies of the piezoelectric elements 20 and 22 and because of the relation of the outer electrode voltage to the vibrating plate 18 acting as a central electrode, if one piezoelectric element elongates in the longitudinal direction, the other piezoelectric element shrinks in the longitudinal direction. Consequently, the vibrating plate is flexed and displaced in the up-and-down direction in the figure. Similar principle applies to the piezoelectric vibrating plate 24. The piezoelectric vibrating plates 16 and 24 are set to different lengths such that the gain of the whole vibrator shows a flat frequency characteristic.

In this case, in the present embodiment, spacers 32A and 32B are mounted between the main surface of the enclosure 12 and piezoelectric vibrating plate 24. Also, spacers 34A and 34B are mounted between the piezoelectric vibrating plates 16 and 24. Therefore, excessive amplitudes can be suppressed by presetting the sizes and installation positions of the spacers 32A, 32B, 34A, and 34B to prevent the piezoelectric vibrating plates 16 and 24 from showing amplitudes exceeding designed ranges.

As described so far, according to the present embodiment, the spacers made of a soft material having a Young's modulus of less than 2 GPa are mounted between the enclosure 12 and piezoelectric vibrating plate 24 and between the piezoelectric vibrating plates 24 and 26. Therefore, excessive amplitudes can be suppressed without varying the resonant frequencies of the piezoelectric vibrating plates 16 and 24 so much. Stress applied to the piezoelectric elements 20, 22, 28, and 30 is mitigated. Their destruction is prevented. Furthermore, damage due to contact between the piezoelectric vibrating plate 24 and enclosure 12 or between the piezoelectric vibrating plates 16 and 24 can be prevented. The shock resistance is improved. In consequence, the reliability is improved.

Embodiment 2

Figure 2A:
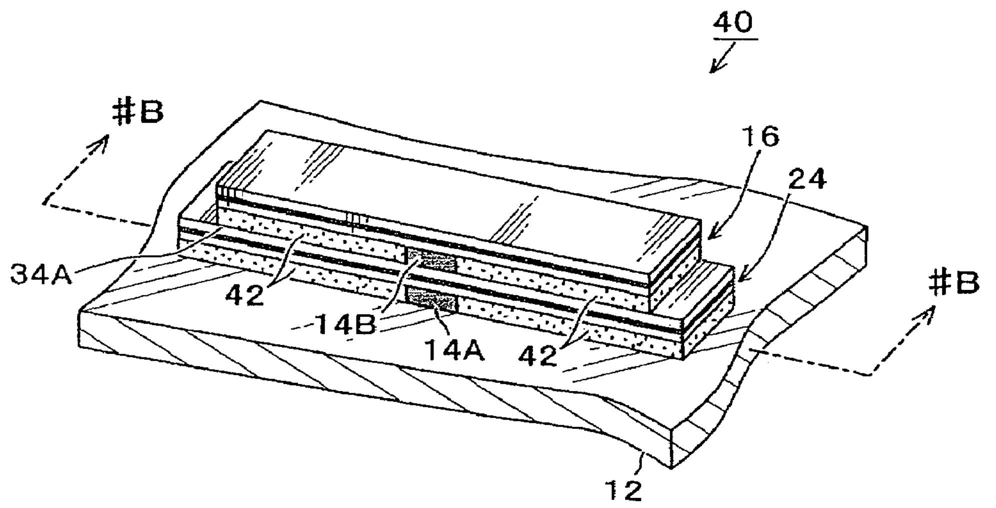
FIG. 2A is a perspective view showing the outer appearance of Embodiment 2 of the invention.
Figure 2B:
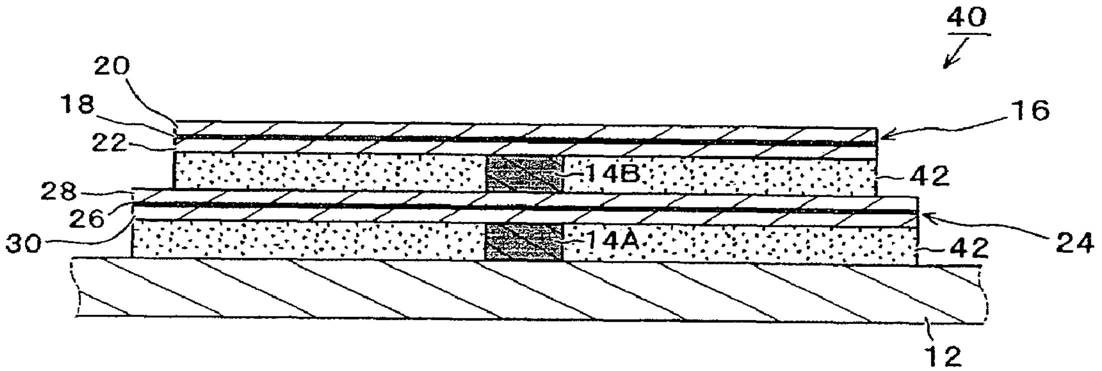
FIG. 2B is a cross-sectional view taken along line #B-#B of FIG. 2A.

Embodiment 2 of the present invention is next described with reference to FIGS. 2A and 2B. FIG. 2A is a perspective view showing the structure of the present embodiment. FIG. 2B shows a cross section taken along line #B-#B of FIG. 2A, as viewed in the direction of the arrows. Identical symbols are used for the components which are identical or correspond to those of the above-described embodiment (the same convention applies to the following embodiments).

As shown in FIGS. 2A and 2B, a piezoelectric vibrator 40 of the present embodiment is fundamentally identical in structure with the above-described embodiment. Piezoelectric vibrating plates 16 and 24 are mounted on a main surface of an enclosure 12 by pillars 14A and 14B so as to be substantially parallel. The space between the main surface of the enclosure 12 and piezoelectric vibrating plate 24 and the space between the piezoelectric vibrating plates 16 and 24 are filled with a flexible resilient material 42. Vibration of the piezoelectric vibrating plates 16 and 24 is transmitted to the enclosure 12 via the resilient material 42. Any material can be used as the resilient material 42 if it has flexibility, a Young's modulus of less than 100 MPa, and a Poisson's ratio of more than 0.45. For example, a gel obtained by swelling a three-dimensionally bridged resin with an organic liquid (in particular, silicone gel obtained by swelling silicone resin with silicone oil) is suitable.

According to the present embodiment, vibration of the piezoelectric vibrating plates 16 and 24 is transmitted to the enclosure 12 via the resilient material 42 that has a quite small modulus of elasticity and a large volume modulus of elasticity. Therefore, vibration in a relatively low frequency range such as the audible range is attenuated only a little. With respect to a displacement having a sharp and large rising edge such as an impact displacement, the acceleration of the displacement can be suppressed. The same advantages as those of the above-described embodiment can be obtained. The spaces may be totally filled with the resilient material 42 or the spaces may be partially filled with it. Where the spaces are partially filled, the assembly workability improves. Furthermore, where the spaces are totally filled, the acceleration-suppressing effect can be obtained stably without being affected by the posture of the piezoelectric vibrator.

Embodiment 3

Figure 3A:
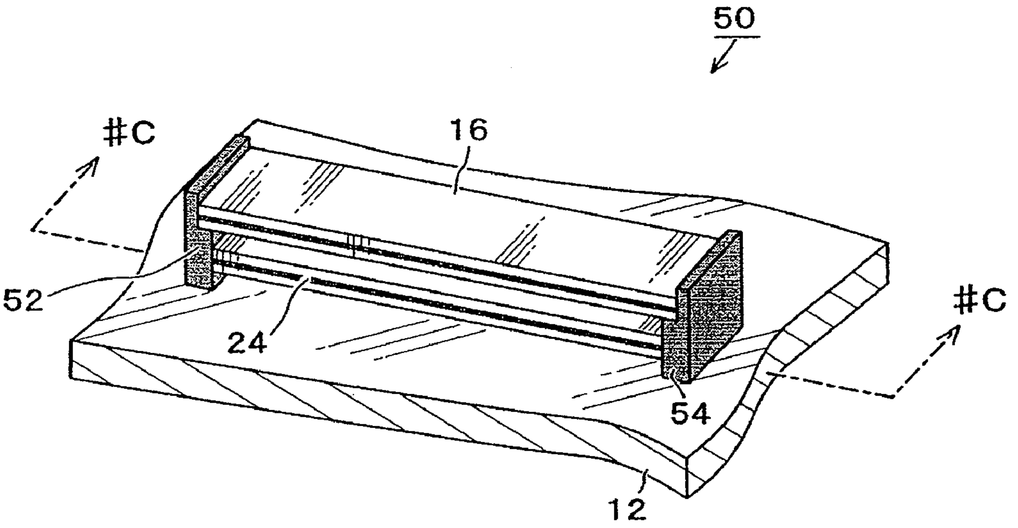
FIG. 3A is a perspective view showing the outer appearance of Embodiment 3 of the invention.
Figure 3B:
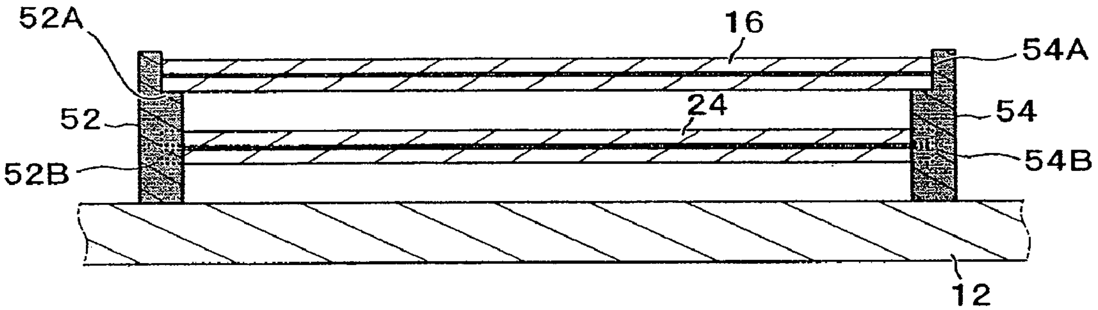
FIG. 3B is a cross-sectional view taken along line #C-#C of FIG. 3A.

Embodiment 3 of the present invention is next described with reference to FIGS. 3A and 3B. FIG. 3A is a perspective view showing the configuration of the present embodiment. FIG. 3B is a cross-sectional view taken along line #C-#C of FIG. 3A, as viewed in the direction of the arrows. In all of the above-described Embodiments 1 and 2, nearly centers of the substantially rectangular piezoelectric vibrating plates 16 and 24 are supported by the pillars 14A and 14B. In the present embodiment, both ends of the piezoelectric vibrating plates 16 and 24 are held by pillars.

As shown in FIG. 3, a piezoelectric vibrator 50 of the present embodiment is so constructed that both ends of the piezoelectric vibrating plates 16 and 24 are supported by pillars 52 and 54 such that the piezoelectric vibrating plates 16 and 24 are substantially parallel to the main surface of an enclosure 12. The piezoelectric vibrating plate 16 is placed on steps 52A and 54A formed above the pillars 52 and 54. The piezoelectric vibrating plate 24 is held with adhesive or the like such that it is fitted over fitting portions 52B and 54B formed under the steps 52A and 54A. The pillars 52 and 54 themselves are bonded to the main surface of the enclosure 12 with adhesive or the like. The structure is such that vibration of the piezoelectric vibrating plates 16 and 24 is transmitted to the enclosure 12.

The pillars 52 and 54 may be made of a homogeneous material (e.g., a material with high rigidity having a Young's modulus of more than 100 GPa) such that vibrations of the piezoelectric vibrating plates 16 and 24 are transmitted from both pillars equally. Alternatively, one pillar (e.g., 52) may be made of a material having a rigidity that is more than 10 times as high as that of the other pillar (e.g., 54). Vibrations of the piezoelectric vibrating plates 16 and 24 may be transmitted from the pillar having the higher rigidity (52 in this case). In this case, a metal having a Young's modulus (e.g., iron-based material such as stainless) of more than 100 GPa can be used as the pillar material having the higher rigidity. A resinous material having a Young's modulus (e.g., PET or nylon) of less than 10 GPa can be used as the material having the lower rigidity. According to the present embodiment, both ends of the piezoelectric vibrating plates 16 and 24 are supported by the pillars 52 and 54 and so even in a case where an impact load is applied, the produced displacement can be suppressed compared with the cantilevered type as in the background art. Accordingly, destruction of the piezoelectric elements can be prevented. Also, undesired large displacements can be suppressed without varying the resonant frequencies so much.

Figure 4A:
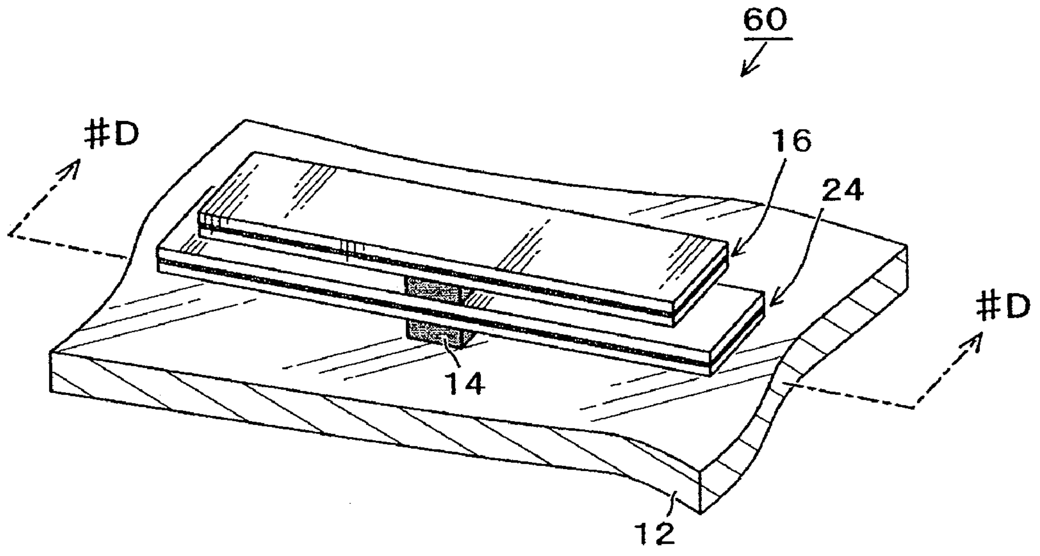
FIG. 4A is a perspective view showing the outer appearance of a comparative example with which the above Embodiments are compared, showing the structure of the comparative example.
Figure 4B:
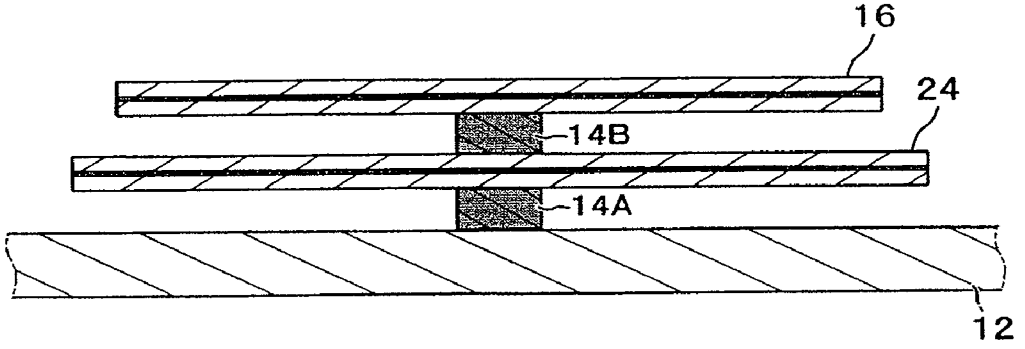
FIG. 4B is a cross-sectional view taken along line #D-#D of FIG. 4A.

The above-described Embodiments 1 to 3 are next described by quoting specific examples. Specific Examples 1-4 and Comparative Examples 1-3 were fabricated as described below. Comparative tests were performed according to a method described below. FIGS. 4A and 4B show the structure of the Comparative Examples. FIG. 4A is a perspective view. FIG. 4B is a cross-sectional view taken along line #D-#D of FIG. 4A, as viewed in the direction of the arrows. A piezoelectric vibrator 60 shown in the figures is fundamentally similar in structure with Embodiment 1 described above. Spacers or the like acting as shock resistant means are not provided at all.

SPECIFIC EXAMPLE 1

The structure was the same as that of Embodiment 1. Nylon having a Young's modulus of 1.2 GPa was used as the spacers. Stainless was used as the pillars.

COMPARATIVE EXAMPLE 1

This was similar in structure with the piezoelectric vibrator 60 shown in FIG. 4. Stainless was used as the pillars.

COMPARATIVE EXAMPLE 2

This was similar in structure with Embodiment 1. Hard nylon having a Young's modulus of 3 GPa was used as the spacers. Stainless was used as the pillars.

SPECIFIC EXAMPLE 2

This was similar in structure with Embodiment 2. A silicone gel having a Young's modulus of 60 MPa and a Poisson's ratio of 0.47 was used as the resilient material. Stainless was used as the pillars.

COMPARATIVE EXAMPLE 3

This was similar in structure with Embodiment 2. A resilient rubber having a Young's modulus of 400 MPa and a Poisson's ratio of 0.4 was used as the resilient material (filling material). Stainless steel was used as the pillars.

SPECIFIC EXAMPLE 3

This was similar in structure with Embodiment 3. Stainless steel having a Young's modulus of 200 GPa was used as both pillars.

SPECIFIC EXAMPLE 4

This was similar in structure with Embodiment 3. A stainless steel having a Young's modulus of 200 GPa was used as one pillar, while a hard nylon having a Young's modulus of 3 GPa was used as the other pillar.

In the manufacture of the above-described Specific Examples and Comparative Examples, each piezoelectric vibrating plate had a length of 40 mm and a width of 7 mm. The thickness of each metallic vibrating portion was 0.04 mm. The thickness of each piezoelectric element was 0.1 mm. Two of such elements were used to construct a bimorph structure. The distance between the piezoelectric vibrating plates 16 and 24 and the distance between the vibrating plate 24 and the main surface of the enclosure 12 were set to 1 mm.

Piezoelectric vibrators of Comparative Examples 1-3 and Specific Examples 1-4 fabricated in this way were mounted to an ABS resin enclosure 12 having dimensions of 50 mm×50 mm and a thickness of 1.5 mm. An AC voltage of 3 V rms was applied. The frequency characteristics of the produced sound were measured. At this time, the distance from the enclosure 12 to a microphone for measurement was set to 10 cm. To check the shock resistance, a shock load of 3000 G was applied using an impact testing machine. After the test, the piezoelectric elements were observed to check whether there were cracks. The results of the test are shown in the following Table 1.

TABLE 1

| | Countermeasure against impact | Material of pillars | 1st order resonant frequency | Sound pressure at 1 kHz | State after application of impact load |
|---|---|---|---|---|---|
| Comparative Example 1 | None | Stainless | 400 Hz | 92 dB | Cracks formed. |
| Specific Example 1 | Insertion of spacers (Young's modulus of 1.2 GPa; nylon) | Stainless | 410 Hz | 93 dB | No cracks. |
| Comparative Example 2 | Insertion of spacers (Young's modulus of 3 GPa; hard nylon) | Stainless | 410 Hz | 93 dB | Cracks formed. |
| Specific Example 2 | Filling with silicone gel (Young's modulus of 60 MPa; Poisson's ratio of 0.47) | Stainless | 420 Hz | 91 dB | No cracks. |
| Comparative Example 3 | Filling with resilient rubber (Young's modulus of 400 MPa; Poisson's ratio of 0.4) | Stainless | 800 Hz | 60 dB | No cracks. |
| Specific Example 3 | Both ends of vibrating plate are supported | Stainless (Young's modulus of 200 GPa) | 420 Hz | 92 dB | No cracks. |
| Specific Example 4 | Both ends of vibrating plate are supported | Stainless (Young's modulus of 200 GPa) + hard nylon (3 GPa) | 380 Hz | 91 dB | No cracks. |

Comparison of the results shown in Table 1 reveals that in Comparative Example 1 having no countermeasures against impact, application of an impact load produced cracks. Specific Examples 1-4 having a countermeasure against impact are similar with Comparative Example 1 in resonant frequency and sound pressure. However, generation of cracks was not observed. It can be recognized from these results that the means of this embodiment, i.e., insertion of the spacers, filling with the resilient material, and support of each piezoelectric vibrating plate at both ends, are effective in improving the impact resistance.

In Comparative Example 2, the Young's modulus of the spacers was more than 2 GPa, unlike in Specific Example 1. In Comparative Example 2, the sound quality did not vary but the vibrating plates collided against the spacers, producing cracks. Similarly, in Comparative Example 3 where the Young's modulus of the filler was more than 100 MPa and the Poisson's ratio was less than 0.45 unlike in Specific Example 2, the displacement-suppressing effect was too strong that production of cracks due to excessive displacements did not take place. However, even under normal operating conditions, the displacement was suppressed. The first-order resonant frequency was as high as 800 Hz. The sound pressure decreased to 60 dB. It can be seen from the results given so far that it is important that the Young's modulus of the spacers, the Young's modulus of the filling resilient material, and the Poisson's ratio be within their respective appropriate ranges given in the Specific Examples above.

Embodiment 4

Figure 5C:
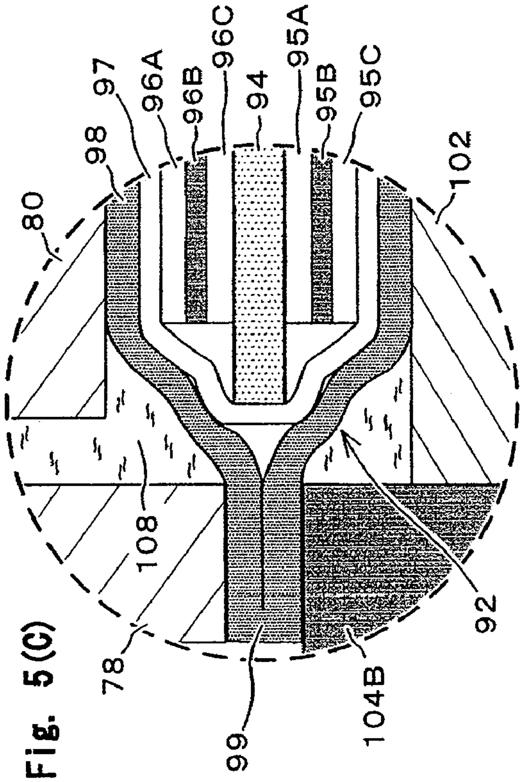
FIGS. 5C and 5D are enlarged views of parts of FIG. 5B.
Figure 5D:
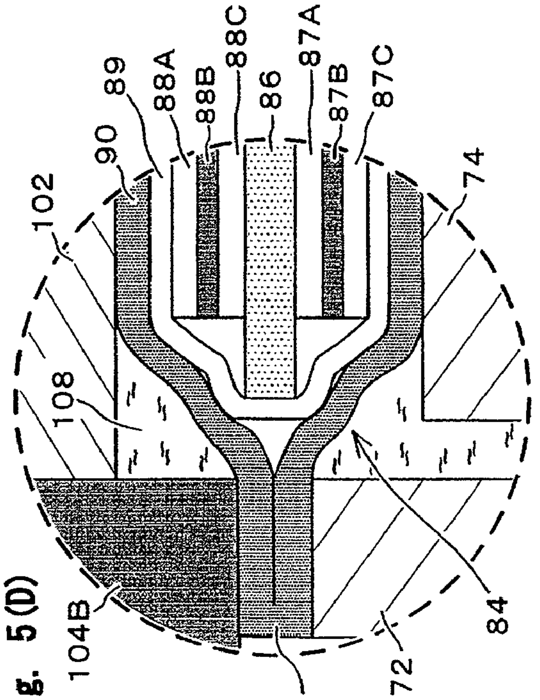
Figure 5A:
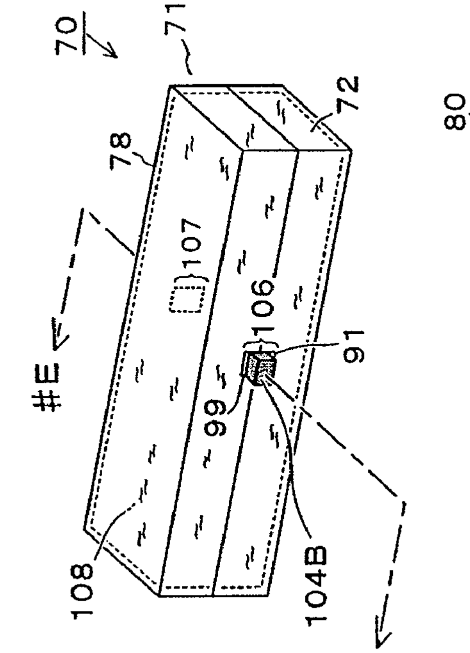
FIG. 5A is a perspective view showing the outer appearance of Embodiment 5 of the invention.
Figure 5B:
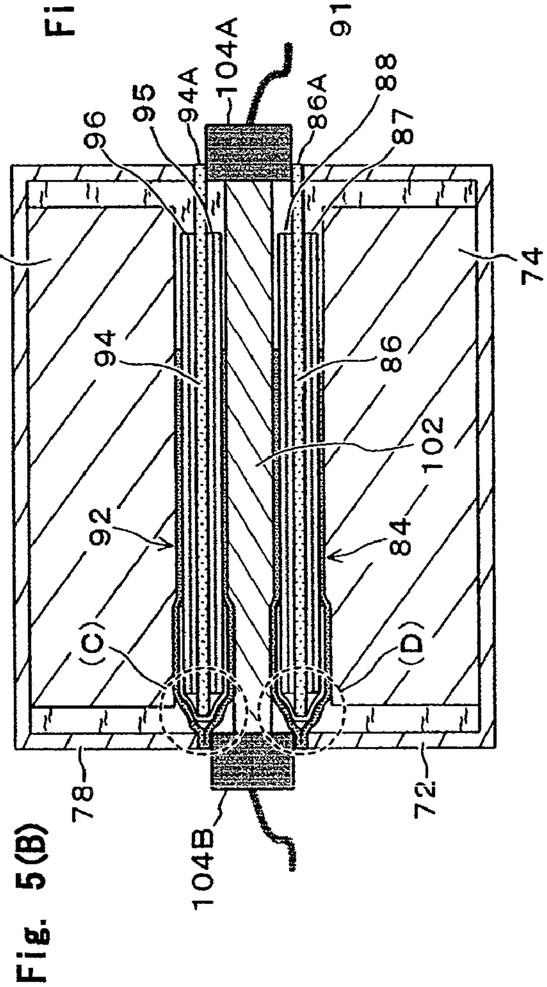
FIG. 5B is a cross-sectional view taken along line #E-#E of FIG. 5A.
Figure 6:
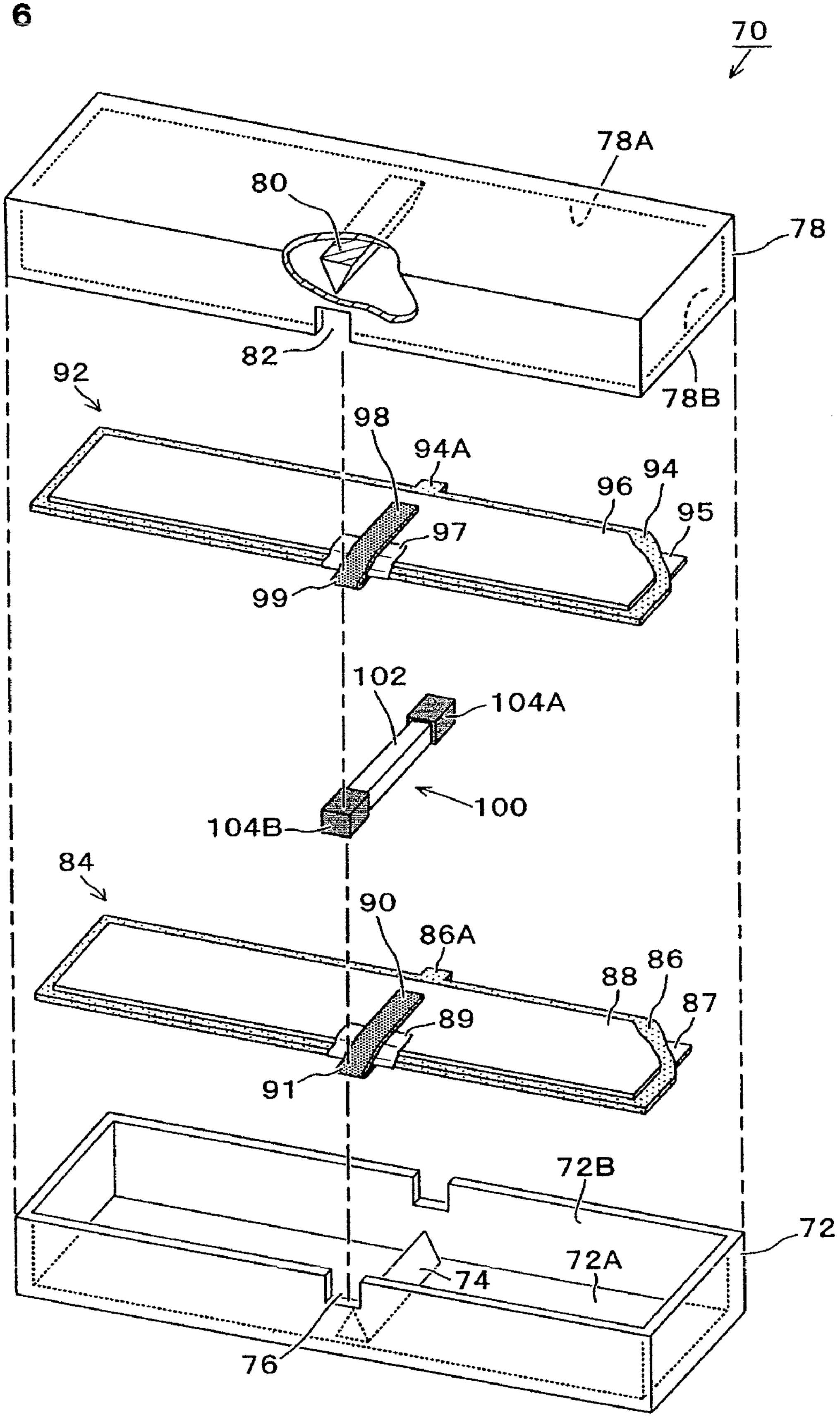
FIG. 6 is an exploded perspective view showing the configuration of the above Embodiments.

Embodiment 4 of the present invention is next described with reference to FIGS. 5A-5D and 6. FIG. 5A is a perspective view showing the outer appearance of the present embodiment. FIG. 5B is a cross-sectional view taken along line #E-#E of FIG. 5A, as viewed in the direction of the arrows. FIGS. 5C and 5D are enlarged views of parts of FIG. 5B, showing electrical connection. FIG. 6 is an exploded perspective view showing the configuration of the present embodiment. As shown in these figures, a piezoelectric vibrator 70 of the present embodiment has a case 71 capable of being split up and down. Piezoelectric vibrating plates 84 and 92 are received substantially parallel within the case 71. The inside of the case 71 is filled with a viscous liquid 108 for suppressing rapid acceleration of vibration. Vibration is transmitted to the panel to which the case 71 is mounted, by means of a pillar 74 mounted on the bottom surface 72A of the lower case 72, a pillar 80 mounted on the upper surface 78A of the upper case 78, and a support rod 100 disposed between the piezoelectric vibrating plates 84 and 92.

Firstly, the case 71 is so designed that it can be split into a lower case 72 and an upper case 78 as mentioned previously. The pillar 74 in contact with the piezoelectric vibrating plate 84 is previously incorporated around the center of the bottom surface 72A of the lower case 72. The pillar 74 is shaped like a triangular pole of substantially triangular cross section that is sharpened toward the piezoelectric vibrating plate 84 not to hinder the vibration of the piezoelectric vibrating plate 84. In the illustrated embodiment, the cross section is substantially triangular. The cross-sectional shape may be trapezoidal or semicircular if it does not hinder the vibration of the piezoelectric vibrating plate 84. A receiver portion 76 for receiving protruding portions 86A and 91 mounted to the piezoelectric vibrating plate 84 is formed at the upper end of a substantially central portion of the side surface 72B of the lower case 72. The upper case 78 is constructed similarly. The pillar 80 is mounted on the upper surface 78A. A receiver portion 82 for receiving protruding portions 94A and 99 mounted to the piezoelectric vibrating plate 92 is formed at the lower end of a substantially central portion of the side surface 78B.

The case 71 is molded from a metal-based material such as stainless steel or a resinous material such as PET or ABS. In the illustrated embodiment, the piezoelectric vibrating plates 84 and 92 are sandwiched from above and below. They may also be sandwiched from left and right. A cover may be placed on one of the top and bottom sides or on one of the left and right sides.

Then, as shown in FIG. 5D, with respect to the piezoelectric vibrating plate 84, the piezoelectric vibrating plate 86 is made of a metal plate or the like. Piezoelectric elements 87 and 88 are bonded to the surface of the vibrating plate 86 to form a bimorph structure. The piezoelectric element 87 is designed such that electrode layers 87A and 87C are formed on the front and rear surfaces of a piezoelectric layer 87B. Similarly, with respect to the piezoelectric element 88, electrode layers 88A and 88C are formed on the front and rear surfaces of the piezoelectric layer 88B. A protruding portion 86A acting also as pullout portions of the vibrating plate 86 and electrode layers 87A, 88C are formed around the center of the longer side of the vibrating plate 86 and is anchored to a receiver portion 76 formed at the fringes of the lower case 72. In the illustrated embodiment, the protruding portion 86A is formed integrally with the vibrating plate 86. A conductive tape 90 of copper, carbon, or the like is applied close to the center of the piezoelectric vibrating plate 84 on the longer side opposite to the protruding portion 86A via insulating film 89 of PET or the like.

The fringes of the piezoelectric vibrating plate 84 are sandwiched between the insulating film 89 and conductive tape 90 from up and down. The film and tape are mounted such that their overlapping portions extend outwardly. The extending protruding portion 91 is anchored to the receiver portion 76 of the lower case 72 and forms pullout portions of the upper electrode layer 88A of the piezoelectric element 88 and lower electrode layer 87C of the piezoelectric element 87. If the piezoelectric vibrating plate 84 of the construction described so far is lowered from above the lower case 72 in such a way that the protruding portions 86A and 91 are fitted over the receiver portion 76, the piezoelectric vibrating plate 84 can be fastened substantially parallel at a preset height position within the lower case 71.

Similarly, with respect to the other piezoelectric vibrating plate 92, as shown in FIG. 5C, piezoelectric elements 95 and 96 are bonded on a vibrating plate 94, forming a bimorph structure. A protruding portion 94A is formed on the vibrating plate 94. Insulating film 97 and conductive tape 98 are located on the longer side opposite to the protruding portion 94A such that the piezoelectric element 96 is sandwiched between them. These protruding portions 99 of the tape act as a positioning portion relative to the upper case 78 and as an electrode pullout portion. That is, the protruding portion 94A acts as pullout portions of the vibrating plate 94, lower electrode layer 96C of the piezoelectric element 96, and upper electrode layer 95A of the piezoelectric element 95. The protruding portion 99 acts as pullout portions of the upper electrode layer 96A of the piezoelectric element 96 and lower electrode layer 95C of the piezoelectric element 95. Positioning can be easily carried out if the upper case 78 is lowered from above the piezoelectric vibrating plate 92 as described above and the receiver portion 82 is fitted over the protruding portions 94A and 99.

The support rod 100 positioned between the piezoelectric vibrating plates 84 and 92 is next described. The support rod 100 is a rodlike body of substantially rectangular cross section. Connector terminals 104A and 104B for making electrical connection with the electrode layers of the piezoelectric vibrating plates 84 and 92 are mounted on both ends of the body 102. The connector terminals 104A and 104B are fabricated by applying a conductive adhesive such as silver or copper, for example. Furthermore, electrical connection between the piezoelectric vibrating plates 84 and 92 can be made by using a spring of phosphor bronze plated with gold or otherwise processed instead of the support rod 100 and by bringing the spring into contact. That is, if the piezoelectric vibrating plate 84, support rod 100, and piezoelectric vibrating plate 92 are superimposed, the protruding portions 86A and 94A of the piezoelectric vibrating plates 84 and 92 make electrical connection with the connector terminal 104A of the support rod 100. The other protruding portions 91 and 99 are connected with the connector terminal 104B. Thus, the electrodes of the piezoelectric elements 86 and 92 on both surfaces can be electrically conducted.

As shown in FIG. 6, the various portions of the structure described so far can be easily aligned relative to each other by fitting the piezoelectric vibrating plate 84 over the lower case 72 preincorporating the pillar 74, placing the piezoelectric vibrating plate 92 over the plate 84 via the support rod 100, and placing the upper case 78 incorporating the pillar 80 from above the plate 92 such that the receiver portion 82 fits over the protruding portions 94A and 99. Furthermore, the connector terminal 104B and protruding portions 91, 99 are exposed from a window 106 formed in a position where the receiver portion 76 of the lower case 72 and the receiver portion 82 of the upper case 78 abut against each other. Similarly, the connector terminal 104A and protruding portions 86A and 94A are exposed from a window 107 on the opposite side. Driving electrical signals can be applied to the piezoelectric vibrating plates 84 and 92 by connecting lead wires with them. Finally, if the case 71 is sealed, the viscous liquid 108 is sealed into the case 71 by making use of an injector, for example. Any liquid may be used as the viscous liquid 108 if it does not hinder vibration of the piezoelectric vibrating plates 84 and 92 caused by an electrical signal. For instance, silicone oil or the like is used. In addition, if the aforementioned conditions are satisfied, gel-like low-viscosity material or jelly-like matter may be sealed, as well as the viscous liquid.

In this way, according to the present embodiment, one or more of the following advantages (including each advantage described within each section) are obtained.

(1) Since the piezoelectric vibrating plates 84 and 92 having the protruding portions 86A, 91, 94A, and 99 acting also as positioning and electrode pullout portions are entered in the case 71 incorporating the pillars 74 and 80, the mounting is facilitated. Positioning of the piezoelectric vibrating plates 84 and 92 can be easily performed. In addition, the mounting is facilitated from a viewpoint of electrical connection, because the piezoelectric vibrating plates 84 and 92 are supported by the support rod 100 provided with the connector terminals 104A and 104B.

(2) The case structure permits easy handling. It is not necessary to take account of the effects on the surroundings of the mounted parts by the exposure of the piezoelectric vibrating plates 84 and 92. Furthermore, the sealed structure of the case 71 prevents the piezoelectric vibrating plates 84 and 92 from coming off the pillars 74 and 80. This further facilitates mounting. Also, a cost reduction can be expected.

(3) Since the viscous liquid 108 is sealed in the case 71, if excessive stress is applied to the piezoelectric vibrating plates 84 and 92, quick deformation acceleration of the piezoelectric vibrating plates 84 and 92 is suppressed. This prevents bending of the vibrating plates and cracks in the piezoelectric bodies. The shock resistance can be improved. At the same time, electromotive force due to deformation can be reduced. Additionally, improvement of the shock resistance permits the vibrator to be adopted in a mobile appliance that requires durability.

Embodiment 5

Figure 7:
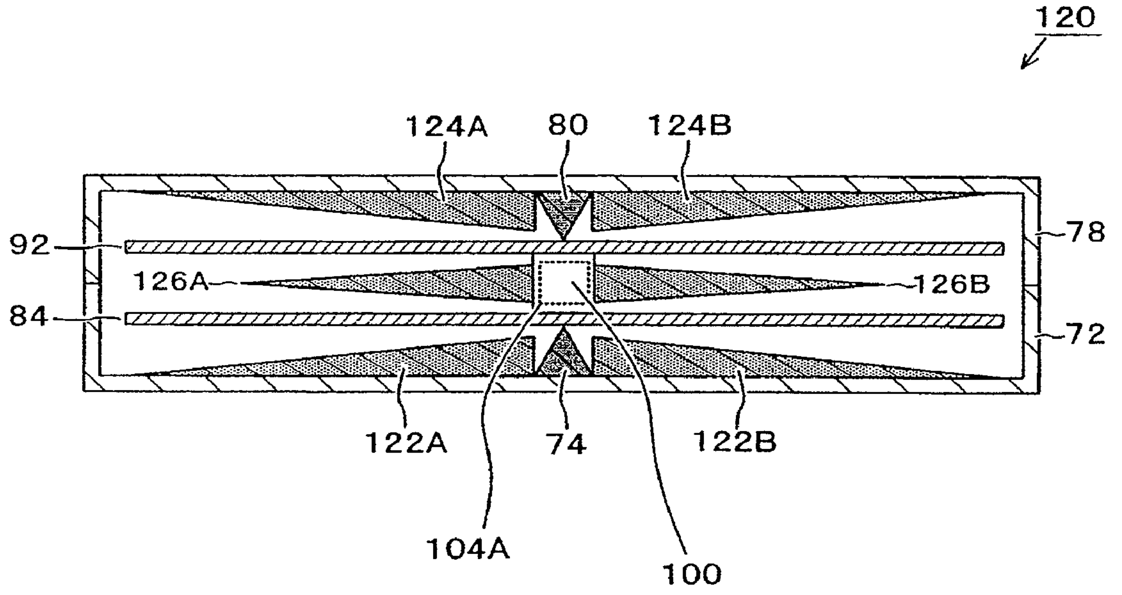
FIG. 7 is a main cross-sectional view showing the structure of Embodiment 5 of the invention.

Embodiment 5 of the present invention is next described with reference to FIG. 7. In the present embodiment, piezoelectric vibrating plates are sealed within a case, in the same way as in the above-described Embodiment 4. FIG. 7 is a main cross-section showing the structure of the present embodiment. Note that identical symbols are used for components which are identical or correspond to those of Embodiment 4 described above.

As shown in FIG. 7, in a piezoelectric vibrator 120 of the present embodiment, slopes 122A, 122B, 124A, and 124B made of a resilient material are formed on the bottom and top surfaces of a case 71 incorporating pillars 74 and 80 that support piezoelectric vibrating plates 84 and 92. Furthermore, slopes 126A and 126B are formed on the side surfaces of a support rod 100 provided with an electrical connector terminal 104A. That is, the slopes are formed between the piezoelectric vibrating plates 84, 92 and case 71 and between the piezoelectric vibrating plates 84 and 92. The thickness of each of the slopes 122A-126A and 122B-126B decreases from the center toward the outside not to hinder necessary vibrations of the piezoelectric vibrating plates 84 and 92. The shock resistance can be improved by providing these slopes. The length of the slopes is set at will within a range in which the shock is not mitigated and vibrations caused by electrical signals are not hindered. Moreover, if vibrations of the piezoelectric vibrating plates 84 and 92 caused by electrical signals are not hindered, the slopes may be in contact with the piezoelectric vibrating plates 84 and 92. The mounting method and electrode pullout structure of the present embodiment are similar to those of the above-described embodiments.

In this way, according to the present embodiment, local excessive deformation of the piezoelectric vibrating plates 84 and 92 are suppressed because the slopes 122A-126A and 122B-126B are formed. The same advantages are obtained as those of the Embodiment 4. In addition, the shock resistance can be improved further by fabricating the slopes 122A-126A and 122B-126B from a resinous material such as PET or ABS or from a resilient material such as foamed rubber.

Embodiment 6

Figure 8:
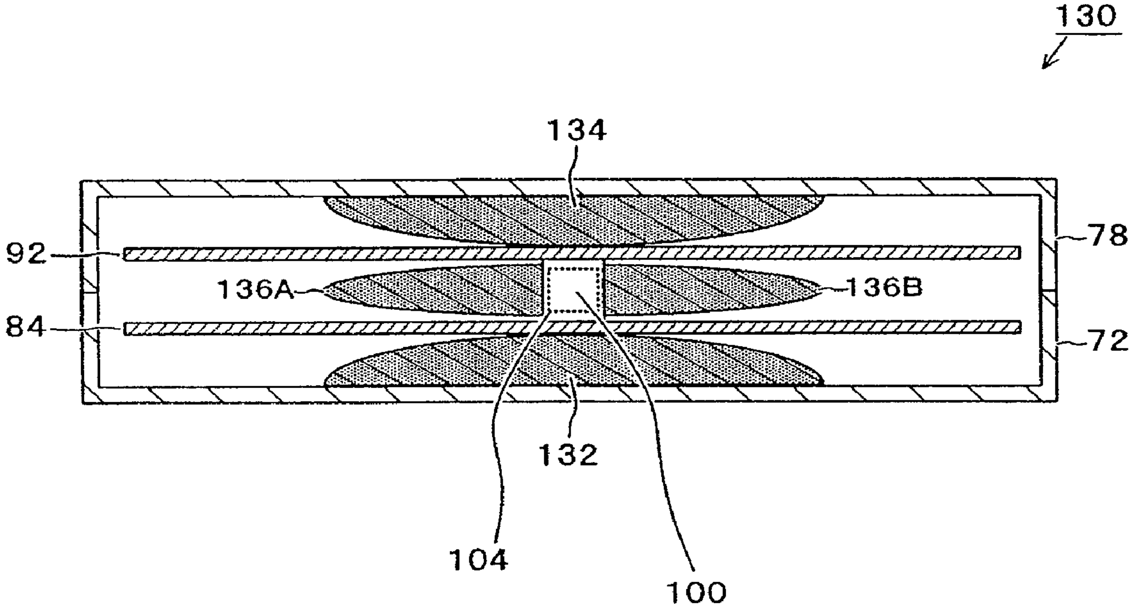
FIG. 8 is a main cross-sectional view showing the structure of Embodiment 6 of the invention.

Embodiment 6 of the present invention is next described with reference to FIG. 8. FIG. 8 is a main cross-sectional view of this embodiment. In the above Embodiment 5, the slopes are formed apart from the pillars with in the case 71. A piezoelectric vibrator 130 of the present embodiment gives an example in which slopes act also as pillars. As shown in FIG. 8, a curved slope 132 that is thickest in the center is formed on the bottom surface of a lower case 72. The slope 132 corresponds to the pillar 74 and slopes 122A and 122B in the above embodiment. A similar curved slope 134 is formed on the top surface of the upper case 78. Furthermore, curved slopes 136A and 136B are formed on the side surface of a support rod 100. The shapes and sizes of the slopes 132, 134, 136A, and 136B are set, based on the same standards as in the above Embodiment 5. Also, similar materials are used. Additionally, the operation and advantages of the present embodiment are similar to those of the above embodiments.

The present invention is not limited to the above embodiments. Various changes can be made within a scope not deviating from the gist of the present invention. For example, the following are also included.

(1) The materials, shapes, and dimensions shown in the above embodiments merely give examples. The design can be modified so as to produce similar operation. The structure of each piezoelectric vibrating plate may be either the unimorph or bimorph structure. Furthermore, the piezoelectric element itself may be a laminate structure in which piezoelectric layers and electrode layers are alternately stacked. The number of the stacked layers, the connection pattern of the internal electrodes, the pullout structure, and so on may be appropriately modified according to the need. Moreover, in the above aspect, two piezoelectric vibrating plates are used. More piezoelectric vibrating plates may be used. A structure including only one piezoelectric vibrating plate may be adopted. The number may be appropriately increased or reduced according to the circumstances. Additionally, the above embodiments may be combined. For example, the inside of the case of Embodiment 5 or Embodiment 6 is filled with the viscous liquid shown in Embodiment 4.

(2) The shape of the spacers shown in the above Embodiment 1 gives an example. The shape may be appropriately modified to produce similar advantages. For example, the slope shape shown in Embodiments 5 and 6 is adopted. Furthermore, in the above Embodiment 1, the spacers are mounted on the main surface of the enclosure 12 and on the piezoelectric vibrating plate 24. Their positions may be appropriately changed to produce similar advantages. For example, in a piezoelectric vibrator 140 shown in FIG. 9A, two piezoelectric vibrating plates 156 and 158 are supported on the inner bottom surface 144 of the enclosure 142 substantially horizontally by a pillar 154. Protrusions 152A-152C are formed on the inner side surface 148 of the enclosure 142 in positions where they restrict the amplitudes of the piezoelectric vibrating plates 156 and 158. Similar protrusions 152D-152F are formed on the side surface 150 opposite to the side surface 148. The protrusions 152A-152F are made of a resilient material similar to that of the spacers 32A, 32B, 34A, and 34B of the above Embodiment 1. That is, in the Embodiment 1, the spacers are mounted on the bottom surface of the enclosure 12 and on the piezoelectric vibrating plate 24. In the present embodiment, spacers are mounted on the side surfaces of the enclosure 142. This can produce the same advantages as the above embodiments.

Figure 9:
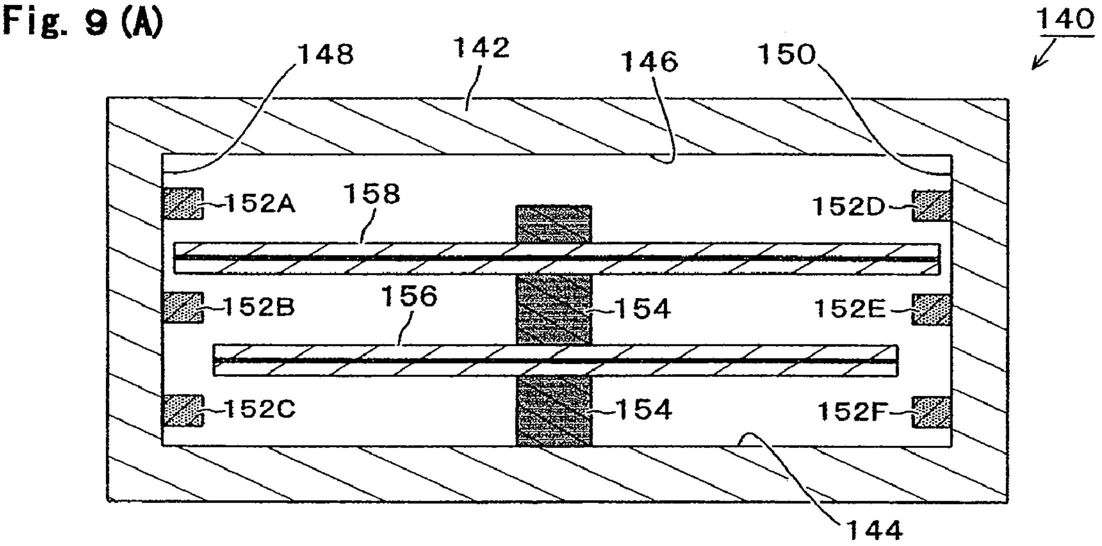
FIGS. 9A to 9C are views showing other embodiments of the invention.
Figure 9:
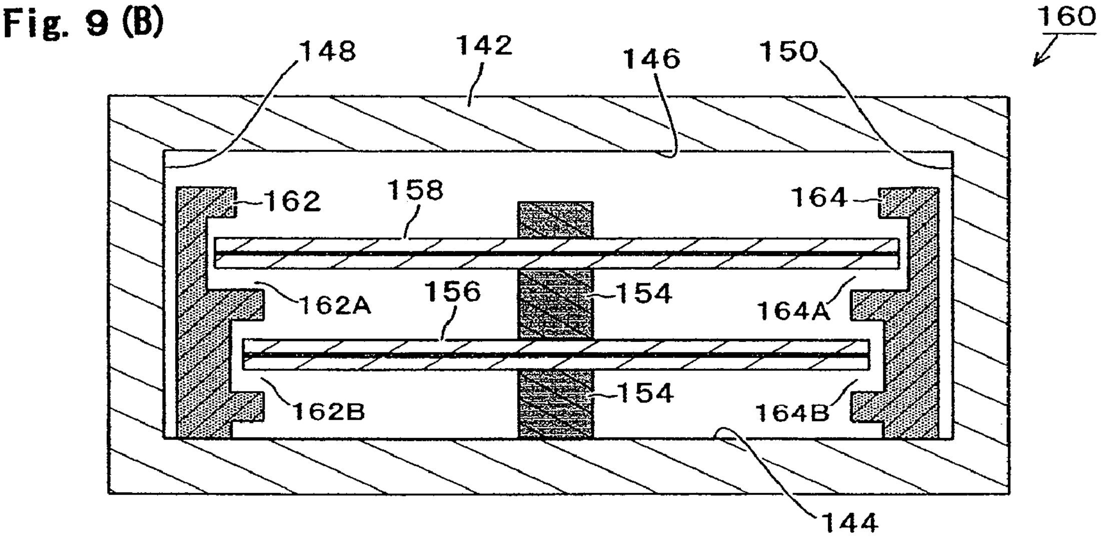
Figure 9:
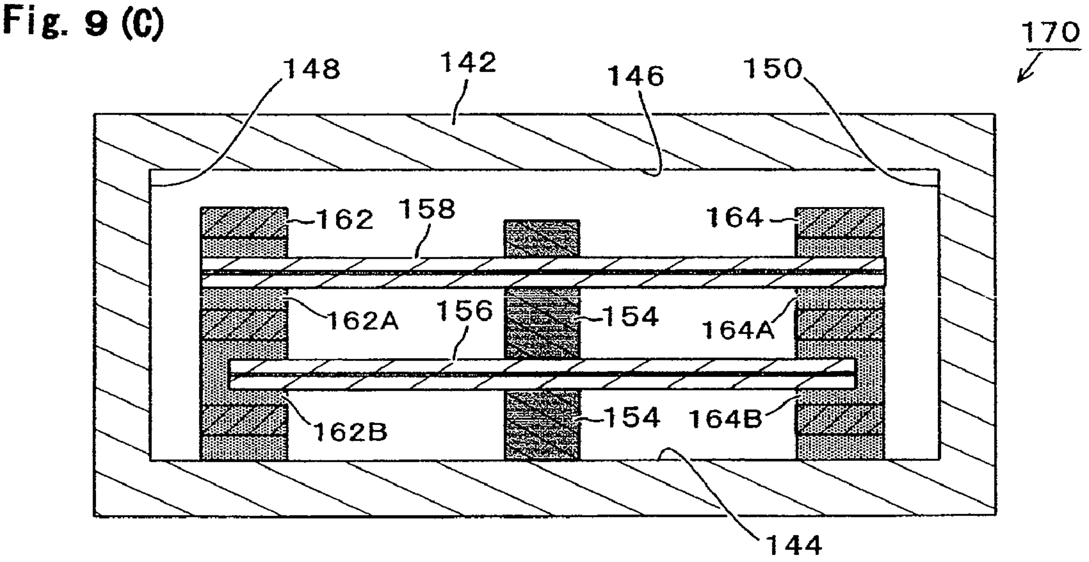
Figure 10:
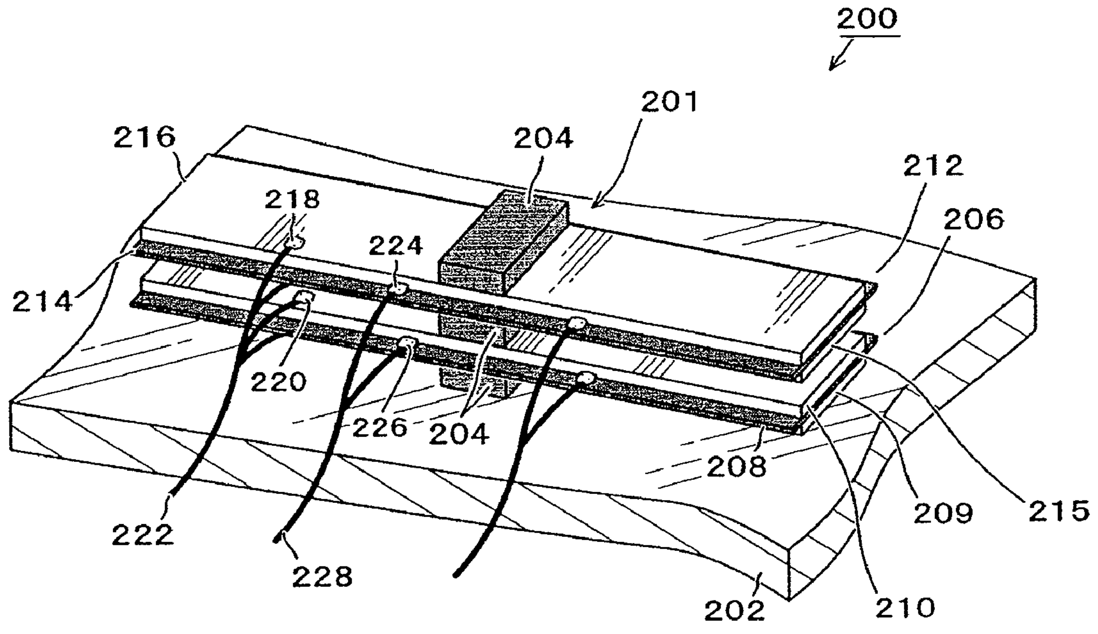
Fig. 10 Prior Art
FIG. 10 is a view showing one example of the background art.

Furthermore, as in a piezoelectric vibrator 160 shown in FIG. 9B, pillars 162 and 164 made of a material similar to the material of the protrusions 152A-152F of the above embodiment may be formed on the bottom surface 144 of an enclosure 142. The amplitudes of the piezoelectric vibrating plates 156 and 158 may be limited by limiting portions 162A, 162B, 164A, and 164B formed on the pillars 162 and 164. The present embodiment is so configured that both ends of the piezoelectric vibrating plates 156 and 158 are sandwiched between the oppositely disposed pillars 162 and 164. As in a piezoelectric vibrator 170 shown in FIG. 9C, the amplitudes of the piezoelectric vibrating plates 156 and 158 may be limited by arranging open portions of the limiting portions 162A, 162B, 164A, and 164B of the pillars 162 and 164 in such a way that these open portions are oriented in the same direction (in the illustrated embodiment, in the direction approaching the observer of the figure).

(3) Preferred examples of application of the present invention include speakers of various electronic appliances such as mobile phone, personal digital assistant (PDA), voice recorder, and personal computer. Besides, the invention may be applied to various applications including actuators.

According to the present invention, the shock resistance of the piezoelectric vibrating plate is improved in some embodiments so that the invention can preferably be applied to an appliance or device to which an impact is applied when dropped such as a mobile phone.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A piezoelectric vibrator comprising:

at least one piezoelectric vibrating plate comprising piezoelectric elements on which electrodes are formed;

an enclosure having a main surface on which the piezoelectric vibrating plate is supported so as to be vibratable;

a support member mounted around a center of said piezoelectric vibrating plate and supporting the piezoelectric vibrating plate nearly or substantially parallel to the main surface of the enclosure; and an acceleration suppression material filling a space between said piezoelectric vibrating plate and said main surface and transmitting vibration of said piezoelectric vibrating plate to said main surface, wherein said acceleration suppression material fills the entire space between said piezoelectric vibrating plate and said main surface.

2. The piezoelectric vibrator as set forth in claim 1, wherein said at least one piezoelectric vibrating plate is plural in number, and every adjacent two of the plural piezoelectric vibrating plates are supported by another support member mounted therebetween around their center nearly or substantially parallel to each other, and wherein another acceleration suppression material fills a space between said adjacent two piezoelectric vibrating plates.

3. The piezoelectric vibrator as set forth in claim 2, wherein said other support member is mounted exclusively around the center of said adjacent two piezoelectric vibrating plates.

4. The piezoelectric vibrator as set forth in claim 2, wherein said other acceleration suppression material is made of a resilient material having a Young's modulus of less than 200 MPa and a Poisson's ratio of more than 0.45.

5. The piezoelectric vibrator as set forth in claim 4, wherein said acceleration suppression material is made of a gel obtained by swelling a three-dimensionally bridged resin with an organic liquid.

6. The piezoelectric vibrator as set forth in claim 5, wherein said gel is a silicone gel obtained by swelling silicone resin with silicone oil.

7. The piezoelectric vibrator as set forth in claim 2, wherein said other acceleration suppression material fills the entire space between said adjacent two piezoelectric vibrating plates.

8. The piezoelectric vibrator as set forth in claim 1, wherein said acceleration suppression material is made of a resilient material having a Young's modulus of less than 200 MPa and a Poisson's ratio of more than 0.45.

9. The piezoelectric vibrator as set forth in claim 8, wherein said acceleration suppression material is made of a gel obtained by swelling a three-dimensionally bridged resin with an organic liquid.

10. The piezoelectric vibrator as set forth in claim 9, wherein said gel is a silicone gel obtained by swelling silicone resin with silicone oil.

* * * * *